US010367247B2

(12) United States Patent
Yin et al.

(10) Patent No.: US 10,367,247 B2
(45) Date of Patent: Jul. 30, 2019

(54) PREPARATION METHOD FOR GAAS/GE/GAAS HETEROGENEOUS SPRINTRONIC (SPIN) DIODE FOR LOOP ANTENNA

(71) Applicant: Xi'an Creation Keji Co., Ltd., Xi'an (CN)

(72) Inventors: Xiaoxue Yin, Xi'an (CN); Liang Zhang, Xi'an (CN)

(73) Assignee: XI'AN CREATION KEJI CO., LTD., Xi'An (CN)

( * ) Notice: Subject to any disclaimer, the term of this patent is extended or adjusted under 35 U.S.C. 154(b) by 0 days.

(21) Appl. No.: 15/854,071

(22) Filed: Dec. 26, 2017

(65) Prior Publication Data

US 2018/0175481 A1 Jun. 21, 2018

Related U.S. Application Data

(63) Continuation of application No. PCT/CN2017/110917, filed on Nov. 14, 2017.

(30) Foreign Application Priority Data

Dec. 20, 2016 (CN) .......................... 2016 1 1184324

(51) Int. Cl.
*H01Q 1/22* (2006.01)
*H01Q 5/321* (2015.01)
(Continued)

(52) U.S. Cl.
CPC ......... *H01Q 1/2283* (2013.01); *H01L 29/868* (2013.01); *H01Q 1/38* (2013.01);
(Continued)

(58) Field of Classification Search
CPC ........ H01Q 1/2283; H01Q 5/321; H01Q 1/38; H01Q 3/34; H01Q 7/00; H01Q 9/0407; H01Q 21/29; H01L 29/868
See application file for complete search history.

(56) References Cited

PUBLICATIONS

Flexible diodes for radio frequency (RF) electronics: a materials perspective, James Semple et al., 2017, IOP Publishing.*
(Continued)

*Primary Examiner* — Seahvosh Nikmanesh
(74) *Attorney, Agent, or Firm* — Hemisphere Law, PLLC; Zhigang Ma

(57) ABSTRACT

A preparation method for a GaAs/Ge/GaAs heterogeneous SPiN diode for a loop antenna includes: selecting a GeOI substrate; etching a top Ge layer of the GeOI substrate to form first and second trenches in the top Ge layer; depositing a GaAs material in, the first and second trenches; performing P-type ion implantation into the GaAs material in the first trench to form a P-type active region and performing an N-type ion implantation into the GaAs material in the second trench to form an N-type active region by ion implantation process; and forming lead holes on surfaces of the P-type active region and the N-type active region and then sputtering a metal to form the GaAs/Ge/GaAs heterogeneous SPiN diode. Therefore, a high performance GaAs/Ge/GaAs heterogeneous SPiN diode suitable for forming a solid-state plasma antenna can be prepared by deep trench isolation technology and ion implantation process.

10 Claims, 10 Drawing Sheets

(51) Int. Cl.
*H01Q 21/29* (2006.01)
*H01Q 3/34* (2006.01)
*H01L 29/868* (2006.01)
*H01Q 1/38* (2006.01)
*H01Q 7/00* (2006.01)
*H01Q 9/04* (2006.01)

(52) U.S. Cl.
CPC .............. *H01Q 3/34* (2013.01); *H01Q 5/321* (2015.01); *H01Q 7/00* (2013.01); *H01Q 9/0407* (2013.01); *H01Q 21/29* (2013.01)

(56) References Cited

PUBLICATIONS

Spintronic nano-scale harvester of broadband microwave energy, Bin Fang et al., 2018.*

* cited by examiner

PREPARATION METHOD FOR GAAS/GE/GAAS HETEROGENEOUS SPRINTRONIC (SPIN) DIODE FOR LOOP ANTENNA

FIELD OF THE DISCLOSURE

The disclosure relates to the field of manufacturing technologies of semiconductor devices, and more particularly to a preparation method for a GaAs/Ge/GaAs heterogeneous spintronic (SPiN) diode for a loop antenna.

BACKGROUND

In recent years, a wireless communication technology is rapidly developed, and requirements of systems on antenna performances are higher and higher. Large capacity, multiple functions and ultra-wideband are important development directions of current wireless communication systems. However, with increase of the numbers of used antennas, overall cost and weight of the communication system are also increased therewith, and a problem about electromagnetic compatibility is also aroused. A phased-array antenna with a relative mature technology has the defects of a complex feed network, a need of increasing phase shifters as well as a high cost and a high technological difficulty caused therefrom. A reconfigurable antenna emerges under such background.

The reconfigurable antenna use a same antenna or antenna array, and a switching device is introduced to control a radiation structure of the antenna to realize conversion of working modes, such that the functions of multiple antennas are realized. Such antenna can change its critical characteristic parameters, such as working frequency, radiation direction pattern, polarization manner, radar scattering section and input impedance according to application needs and has the characteristics of no need of manual intervention and convenience in control. The reconfigurable antenna brings a revolution for the development of antenna technologies, provides important technical guarantees for improving a capacity of the wireless communication systems, expanding functions of the systems, increasing working bandwidths of the systems and realizing, software defined radio, and the like, and will bring a far-reaching influence for the wireless communication technology.

At present, there is one type of reconfigurable antenna on the market, an important constituting part thereof, i.e., a SPiN diode (also referred to as surface positive-intrinsic-negative diode) adopts a bulk silicon material, such material has the problem of lower carrier mobility of an intrinsic region, which affects a carrier concentration of the intrinsic region of the SPiN diode and further affects a concentration of solid-state plasma. Besides, a P region and an N region of such structure mostly adopt an implantation process, and such method requires large implantation dosage and energy, has high requirements on equipment and is incompatible with the existing process. However, when a diffusion process is adopted, a junction depth is deeper, but the P region and N region have relatively larger areas, resulting in a low integration level and an uneven doping concentration, thereby affecting electrical properties of the SPiN diode and leading to poor controllability in concentration and distribution of the solid-state plasma Therefore, it is an urgent problem to select what kind of material and process to manufacture a diode string of a proper material to apply to a loop frequency-reconfigurable antenna.

SUMMARY

Therefore, in order to solve the technical defects and deficiencies in the prior art, the disclosure provides a preparation method for a GaAs/Ge/GaAs heterogeneous SPiN diode for a loop antenna.

Specifically, an embodiment of the disclosure provides a preparation method for a GaAs/Ge/GaAs heterogeneous SPiN diode for a loop antenna. The loop antenna includes: a semiconductor substrate; a dielectric plate; a first SPIN diode ring, a second SPiN diode ring, first direct current (DC) bias wires and second DC bias wires, disposed on the semiconductor substrate; and a coupling type feed source, disposed on the dielectric plate. The first SPiN diode ring, the second SPiN diode ring, the first DC bias wires and the second DC bias wires are formed on the semiconductor substrate by semiconductor process.

In particular, the preparation method for the SPIN diode includes steps of:

(a) selecting a GeOI substrate;

(b) etching, a top Ge layer of the GeOI substrate to form a first trench and a second trench in the top Ge layer;

(c) depositing a gallium arsenide (GaAs) material in the first trench and the second trench;

(d) performing P-type ion implantation into the GaAs material in the first trench to form a P-type active region and performing an N-type ion implantation into the GaAs material in the second trench to form an N-type active region, by ion implantation process; and (e) forming lead holes on surfaces of the P-type active region and the N-type active region and then, sputtering a metal, to form the GaAs/Ge/GaAs heterogeneous SPiN diode.

Moreover, on the basis of the above embodiment, before the step (b), the preparation method further includes:

(x1) preparing a silicon oxide (SiO2) material on a surface of the GeOI substrate to form a first SiO2 layer;

(x2) preparing a silicon nitride (SiN) material on a surface of the first SiO2 layer to form a first SiN layer, to thereby form a first protective layer;

(x3) etching the first protective layer and the GeOI substrate by dry etching with a first mask, to form isolation trenches in the GeOI substrate;

(x4) filling the isolation trenches with an isolation material by a chemical vapor deposition (CVD) process; and (x5) removing the first protective layer and the isolation material outside the isolation trenches by a chemical mechanical polishing (CMP) process, to form an isolation region of the GaAs/Ge/GaAs heterogeneous SPiN diode.

Moreover, on the basis of the above embodiment(s), the step (b) includes:

(b1) preparing a SiO2 material on a surface of the GeOI substrate to form a second SiO2, layer;

(b2) preparing a SiN material on a surface of the second SiO2 layer to form a second SiN layer, and thereby forming a second protective layer; and (b3) etching the second protective layer and the top Ge layer by anisotropic etching with a second mask, to form the first trench and the second trench in the top Ge layer.

Moreover, on the basis of the above embodiment(s), the step (c) includes:

(c1) depositing the GaAs material in the first trench and the second trenches by a metal-organic chemical vapor deposition (MOCVD) process;

(c2) removing the GaAs material of a certain thickness outside the first trench and the second trench by a CMP process to planarize the first trench and the second trench.

Moreover, on the basis of the above embodiment(s), the step (d) includes:

(d1) performing a boron (B) ion implantation into the GaAs material in the first trench by an ion implantation process with a third mask, to form the P-type active region;

(d2) performing a phosphorus (P) ion implantation into the GaAs material in the second trench by an ion implantation process with a fourth mask, to form the N-type active region;

(d3) depositing a SiO2 material on surfaces of the P-type active region and the N-type active region and activating impurities of the P-type active region and the N-type active region by an annealing process; and (d4) removing the SiO2 material.

Moreover, on the basis of the above embodiment(s), the step (e) includes:

(e1) depositing a SiO2 material on, an entire surface of the GeOI substrate;

(e2) etching off the SiO2 material in part of positions in surfaces of the P-type active region and the N-type active region by an anisotropic etching process with a fifth mask, to form the lead holes;

(e3) sputtering a metal material in the lead holes; and (e4) performing a passivation treatment and forming PADs by photolithography, to form the GaAs/Ge/GaAs heterogeneous SPiN diode.

Moreover, on the basis of the embodiment(s), the first SPiN diode ring includes first SPiN diode strings, the second SPiN diode ring includes second SPIN diode strings, and a perimeter of each of the first SPiN diode ring and the second SPiN diode ring is equal to an electromagnetic wavelength of a signal to be received.

In addition, on the basis of the above embodiment(s), the coupling type feed source is formed on the dielectric plate; and the dielectric plate is provided with a metal microstrip patch on an upper surface and a metal grounding plate on a lower surface. The metal microstrip patch includes a main branch, first sub-branches and second sub-branches.

The preparation method for a GaAs/Ge/GaAs heterogeneous SPiN diode for a loop antenna in the disclosure has the following advantages that:

(1) due to the characteristics of high mobility and long carrier service life of the GaAs/Ge/GaAs heterostructure used by the SPiN diode, a solid-state plasma concentration of the SPiN diode can be effectively improved;

(2) the P and N regions of the SPIN diode adopt a polysilicon embedding process based on deep trench etching, such process can provide abrupt junctions P-i and N-i, and can effectively increase junction depths of the P-i junction and the N-i junction, so that the concentration and distribution of solid-state plasma can be controlled well; and (3) the SPiN diode adopts an etching-based deep trench dielectric isolation process, thereby effectively improving a breakdown voltage of the device and inhibiting influences of a leakage current on the device performances.

BRIEF DESCRIPTION OF THE DRAWINGS

Specific embodiments, of the disclosure are explained in detail with reference to accompanying drawings.

DETAILED DESCRIPTION OF PREFERRED EMBODIMENTS

Figure 1:
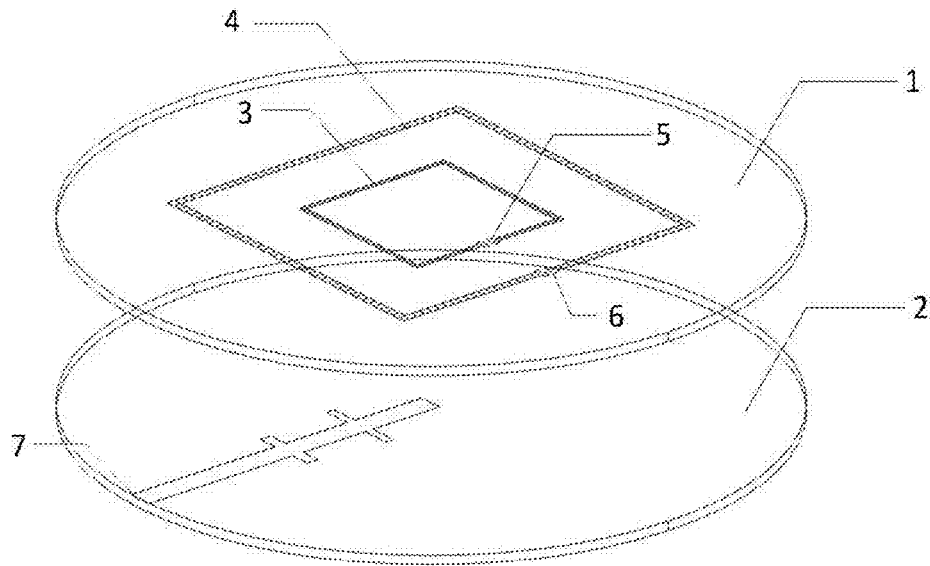
FIG. 1 is a structural schematic view of a reconfigurable loop antenna according to an embodiment of the disclosure.

In order to make the objectives, features and advantages of the disclosure more apparent and easy to understand, the specific embodiments of the disclosure are explained in detail with reference to accompanying drawings.

The disclosure provides a preparation method for a GaAs/Ge/GaAs heterogeneous SPiN diode for a loop antenna. The GaAs/Ge/GaAs based heterogeneous SPiN diode is a solid-state plasma SPiN diode formed based on a germanium-on-insulator (GeOI), when a DC bias voltage is applied, a DC current will form solid-state plasma consisting of free carriers (electrons and holes) on the surface. The plasma has metal-like characteristics, that is, a reflection action for electromagnetic waves, and the reflection characteristic is closely related to microwave transmission characteristics, concentration and distribution of surface plasma.

A transverse solid-state plasma SPiN diode based plasma reconfigurable antenna may be formed by arranging transverse solid-state plasma SPIN diodes in an array, and by selective conductions of solid-state plasma SPiN diodes in the array through an external control, the array is caused to form dynamic strips of the solid-state plasma, which has an antenna function and a function of emitting and receiving specific electromagnetic waves. Such antenna can change the stripe shape and distribution of the solid-state plasma by using selective conductions of the solid-state plasma SPiN diodes in the array, thereby realizing, reconfiguration of the antenna, which has an important application prospect in aspects of national defense communication and radar technologies.

In the following, a process flow for a GaAs/Ge/GaAs based heterogeneous SPiN diode will be further described in detail. In the drawings, for the purpose of convenient explanation, the thicknesses of layers and regions are zoomed in or out, and the shown sizes do not represent actual sizes.

An embodiment of the disclosure provides a preparation method for a GaAs/Ge/GaAs heterogeneous SPiN diode for a loop antenna, and the GaAs/Ge/GaAs heterogeneous SPiN diode is used for manufacturing reconfigurable loop antenna. Referring to FIG. 1, and FIG. 1 is a structural schematic view of a reconfigurable loop antenna according to an embodiment of the disclosure. The loop antenna includes a semiconductor substrate 1; a dielectric plate 2; a first SPiN diode ring 3, a second SPiN diode ring 4 first DC bias wires 5 and second DC bias wires 6 which are all disposed on the semiconductor substrate 1; and a coupling type feed source 7, disposed on the dielectric plate 2. The first SPiN diode ring 3, the second SPiN diode ring 4, the first DC bias wires 5 and the second DC bias wires 6 are all manufactured on the semiconductor substrate 1 by semiconductor process.

Figure 2:
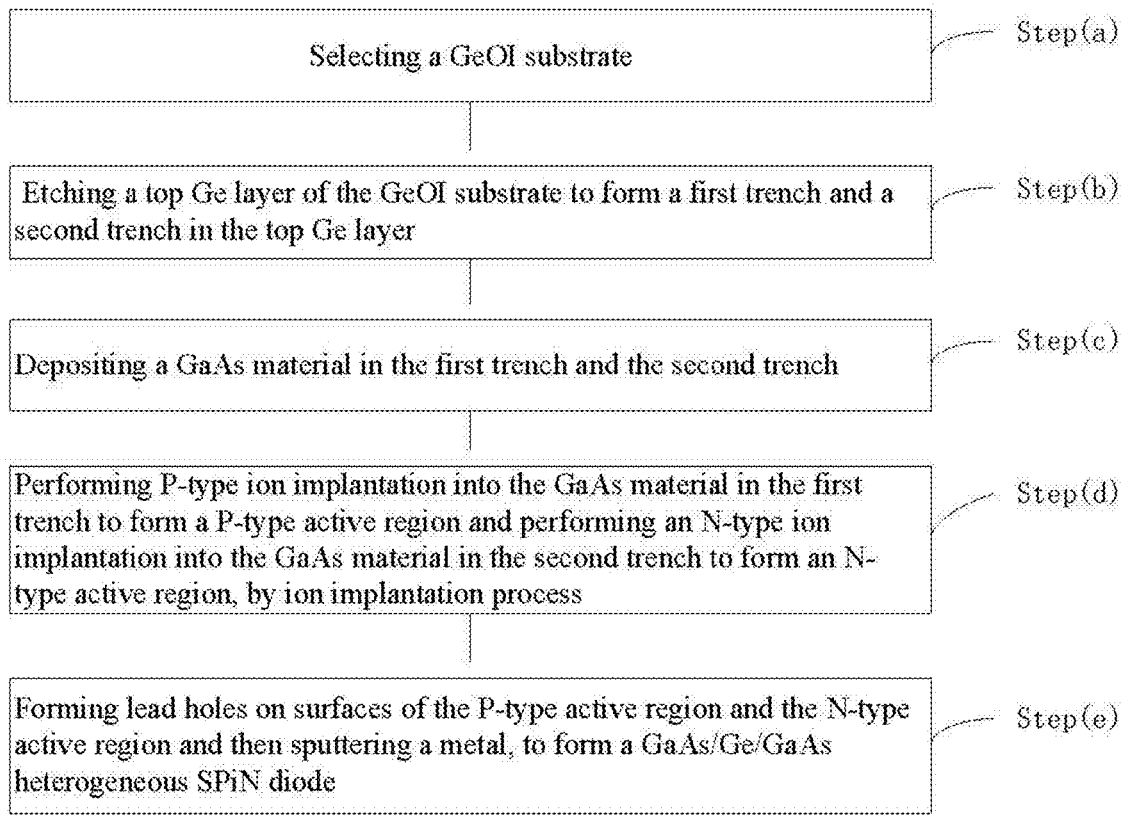
FIG. 2 is a flowchart of a preparation method for a GaAs/Ge/GaAs based heterogeneous SPiN diode according to an embodiment of the disclosure.

Referring to FIG. 2, and FIG. 2 is a flowchart of a preparation method for a GaAs/Ge/GaAs heterogeneous SPiN diode according to an embodiment of the disclosure. The preparation method includes steps of:

(a) selecting a GeOI substrate;

In particular, for the step (a), the cause of adopting the GeOI substrate is that a good microwave characteristic is required for the solid-state plasma antenna, while in order to meet this requirement, the SPiN diode needs to possess good isolation characteristic and limiting capacity for carriers, i.e., the solid-state plasma; and the GeOI substrate can conveniently form a SPiN isolation region with isolation trenches, and the $SiO_2$ can also limit the carriers, i.e., the solid-state plasma within a top Ge layer. Therefore, the GeOI is preferably adopted as a substrate of the solid-state plasma SPiN diode. Besides, a carrier mobility of the Ge material is large, thereby improving device performances.

(b) etching the top Ge layer of the GeOI substrate to form a first trench and a second trench in the top Ge layer;

(c) depositing a GaAs material in the first trench and the second trench;

(d) performing a P-type ion implantation into the GaAs material in the first trench to form a P-type active region and performing an N-type ion implantation into the GaAs material in the second trench to form an N-type active region, by ion implantation process;

In particular, depths of P-type trench and N-type trench each are larger than a thickness of a second protective layer and smaller than a sum of thicknesses of the second protective layer and the top Ge layer of the GeOI substrate; and preferably, a distance between each of bottoms of the P-type trench and the N-type trench and the bottom of the top Ge layer of the substrate is in a range from 0.5 micrometers to 30 micrometers, and a generally recognized deep trench is formed. In this way, high-doping concentration P and N regions with uniformly distributed impurity and steep P-i and N-i junctions can be formed when the P-type and N-type active regions are formed, and it is favorable to improve a plasma concentration of i region (intrinsic region); and (e) forming lead holes on surfaces of the P-type active region and the N-type active region and then sputtering a metal, to form the GaAs/Ge/GaAs' heterogeneous SPIN diode.

Furthermore, on the basis of the above embodiment, before the step (b), the preparation method further includes:

(x1) preparing a $SiO_2$ material on a surface of the GeOI substrate to form a first $SiO_2$ layer;

(x2) preparing a silicon nitride (SiN) material on a surface of the first $SiO_2$ layer to form a first SiN layer, and thereby forming a first protective layer;

(x3) etching the first protective layer and the GeOI substrate by a dry etching process with a first mask, to form isolation trenches in the GeOI substrate;

(x4) filling the isolation trenches with an isolation material by a CVD process; and (x5) removing the first protective layer and the isolation material outside the isolation trenches by a chemical mechanical polishing (CMP) process to form an isolation region for the GaAs/Ge/GaAs heterogeneous SPiN diode.

Furthermore, on the basis of the above embodiment(s), the step (b) includes:

(b1) preparing a $SiO_2$ material on the surface of the GeOI substrate to form a second $SiO_2$ layer;

(b2) preparing a SiN material on, a surface of the second $SiO_2$ layer to form a second SiN layer, and thereby forming a second protective layer; and (b3) etching the second protective layer and the top Ge layer by an anisotropic etching process with a second mask to form the first trench and the second trench in the top Ge layer.

Further, on the basis of the above embodiment(s), before the step (c), the preparation method further includes:

(y1) at 800-900 degrees Celsius, oxidizing the first trench and the second trench to form oxide layers on inner walls of the first trench and the second trench; and (y2) etching the oxide layers on the inner walls of the first trench and the second trench by a wet etching process to planarize the inner walls of first trench and the second trench.

Further on the basis of the above embodiment(s), the step (c) includes:

(c1) depositing a GaAs material in the first trench and the second trench by a MOCVD process; and (c2) removing the GaAs material of a certain thickness outside the first trench and the second trench by a CMP process to planarize the first trench and the second trench.

Further, on the basis of the above embodiment(s), the step (d) includes:

(d1) performing a boron (B) ion implantation into the GaAs material in the first trench by an ion implantation process with a third mask to form the P-type active region; and (d2) performing a phosphorus (P) ion implantation into the GaAs material in the second trench by an ion implantation process with a fourth mask to form the N-type active region;

(d3) depositing a $SiO_2$ material on surfaces of the P-type active region and the N-type active region and activating, impurities of the P-type active region and the N-type active region by an annealing process; and (d4) removing the $SiO_2$ material.

Further, one the basis of the above embodiment(s) the step (e) includes:

(e1) depositing a $SiO_2$ material on an entire surface of the substrate;

(e2) etching the $SiO_2$ material in part of positions in surfaces of the P-type active region and the N-type active region by an anisotropic etching process with a fifth mask, to form the lead holes;

(e3) sputtering a metal material in the lead holes; and (e4) performing a passivation treatment and forming PADs by photolithography, to form the GaAs/Ge/GaAs heterogeneous SPiN diode.

Figure 3:
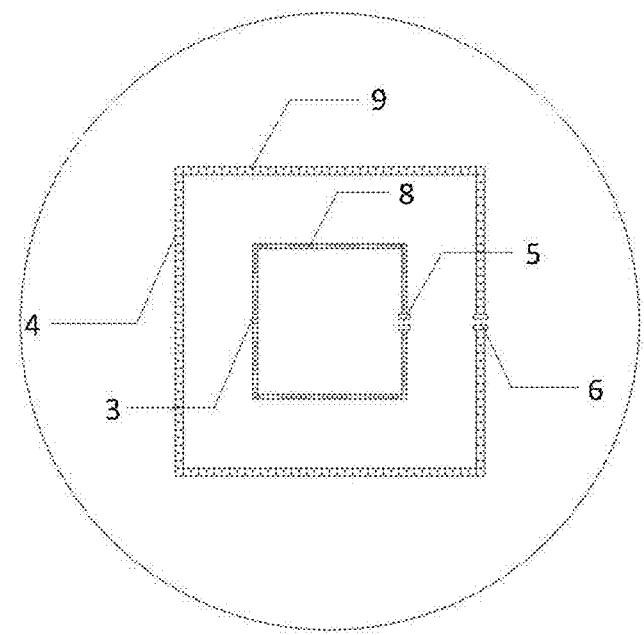
FIG. 3 is a structural schematic view of a semiconductor substrate of a reconfigurable loop antenna provided by an embodiment of the disclosure.

Further, on the basis of the above embodiment(s), referring to FIG. 3, and FIG. 3 is a structural schematic view of a semiconductor substrate of a GeOI base frequency reconfigurable coupling type feeding loop antenna based on the SPiN diode according to an embodiment of the disclosure. The first SPIN diode ring 3 includes first SPiN diode strings 8, the second SPiN diode ring 4 includes second SPiN diode strings 9, and a perimeter of each of the first SPIN diode ring 3 and the second SPiN diode ring 4 is equal to an electromagnetic wavelength of a signal to be received.

Figure 4:
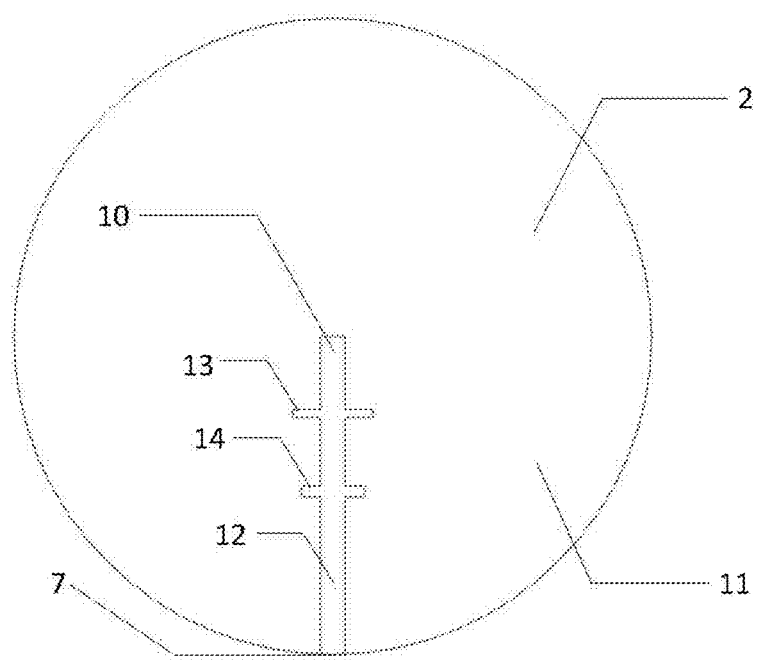
FIG. 4 is a structural schematic view of a dielectric plate of a loop antenna provided by an embodiment of the disclosure.

Further, referring to FIG. 4, and FIG. 4 is a structural schematic view of a dielectric plate of a GeOI base frequency-reconfigurable coupling type feeding loop antenna based on the SPiN diode according to an embodiment of the disclosure. Based on the above embodiment(s), the first DC bias wires 5 and the second DC bias wires 6 are disposed on two ends of the first SPIN diode string 8 and the second SPIN diode string 9; and the first DC bias wires 5 and the second DC bias wires 6 are manufactured on the semiconductor substrate 1 by heavily doped polysilicon. Moreover, a metal microstrip patch 10 includes a main branch 12, first sub-branches 13 and sub-branches 14.

Further, on the basis of the above embodiment(s), the first DC bias wires 5 and the second DC bias wires 6 are individually connected to a positive voltage, and only one group of DC bias wires is connected to the positive voltage at any working moment. The first SPiN diode string (8) or the second SPiN diode string (9) is, selectively in a forward conduction state by controlling, voltages on the first DC bias wires 5 and the second DC bias wires 6. The conducted (i.e., turned-on) SPiN diodes will generate solid-state plasma in their intrinsic regions, which has metal-like characteristics and may serve as a radiation structure of the antenna. When different SPiN diode strings switchably work, an electrical size length of the antenna will be changed, thereby realizing reconfigurable working frequencies of the antenna.

As shown in FIG. 4, the coupling type feed source 7 is manufactured on the dielectric plate 2 by a CVD method. The dielectric plate 2 is provided with a metal microstrip patch 10 on an upper surface and a metal grounding plate 11 on a lower surface. The metal microstrip patch 10 includes the main branch 12, the sub-branches 13 and the sub-branches 14. A width of the metal microstrip patch 10 and a thickness of the dielectric plate 2 are determined by impedance matching of the feed source. In addition, the larger the energy coupled to inner and outer rings is, the larger the width of the main, branch 12 is, Lengths and widths of the first sub-branches 13 and the second sub-branches 14 are determined by impedance matching of the antenna, and standing waves of the antenna can be adjusted by changing the lengths and widths of the first sub-branches 13 and the second sub-branches 14. A distance between the semiconductor substrate and the dielectric plate is determined by a gain of the antenna.

Figure 5:
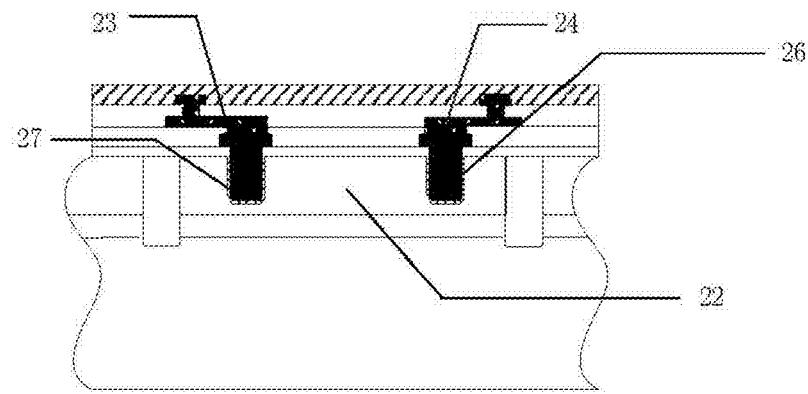
FIG. 5 is a structural schematic view of a GaAs/Ge/GaAs based heterogeneous SPIN diode provided, by an embodiment of the disclosure.
Figure 6:
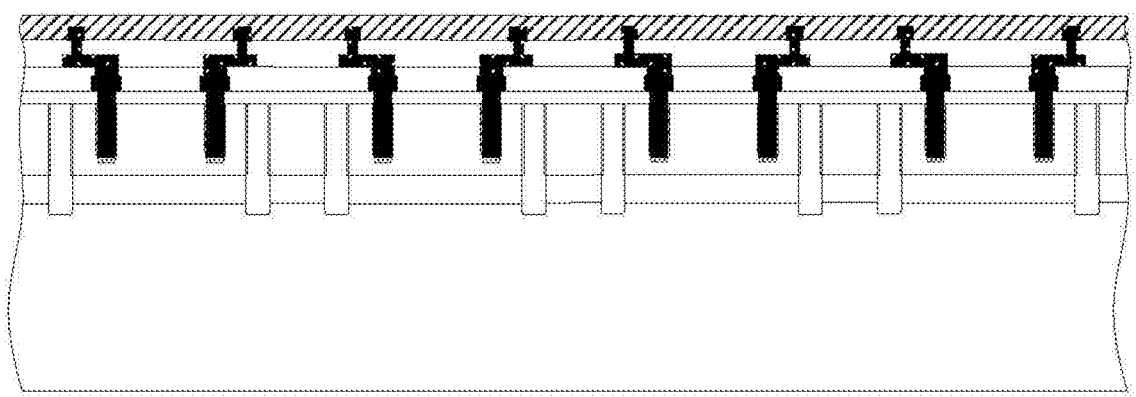
FIG. 6 is a structural schematic view of a GaAs/Ge/GaAs based heterogeneous SPIN diode string provided by an embodiment of the disclosure.

Referring to FIGS. 5 and 6, FIG. 5 is a structural schematic view of a SPiN diode provided by an embodiment of the disclosure, and FIG. 6 is a structural schematic view of a SPiN diode string provided by an embodiment of the disclosure. As shown in FIG. 5, each SPiN diode string includes a plurality of SPIN diodes and these SPiN diodes are connected in series. The SPiN diode consists of a P+ region 27, an N+ region 26 and an intrinsic region 22. A first metal contact region 23 is located on the P+ region 27, a second metal contact region 24 is located on the N+ region 26, the first metal contact region 23 of the SPiN diode on one end of the SPiN diode string is connected to the positive of a DC bias, the second metal contact region 24 of the SPiN diode on the other end of the SPiN diode string is connected to the negative of the DC bias. By applying a DC current, all SPiN diodes in the whole SPIN diode string are in a forward conduction state. When using SPIN diodes being forwardly biased to activate the solid-state plasma, it can be used for electromagnetic radiation of the antenna. When the SPiN diodes are not biased and thus, closed, they present a semiconductor dielectric state, can solve the problem of inter-coupling between the antennas, and are more favorable for designing the reconfigurable antenna.

Figure 7A:
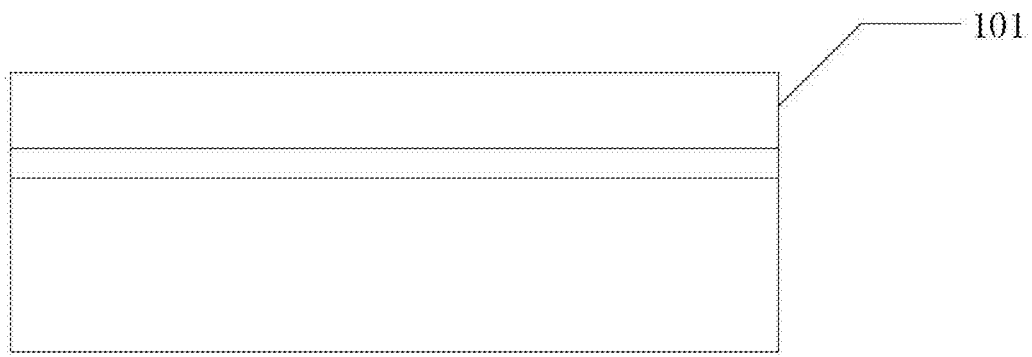
FIGS. 7A to 7R are schematic views of another preparation method for a GaAs/Ge/GaAs based heterogeneous SPiN diode according to an embodiment of the disclosure.
Figure 7B:
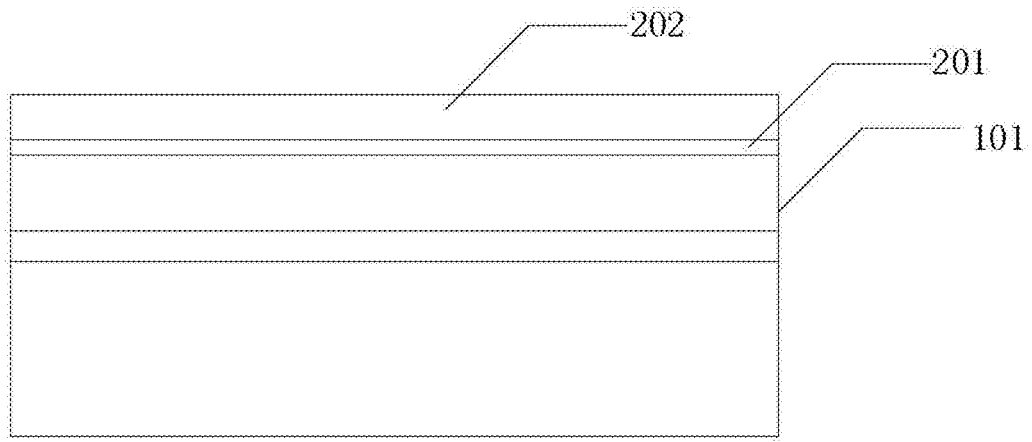
Figure 7C:
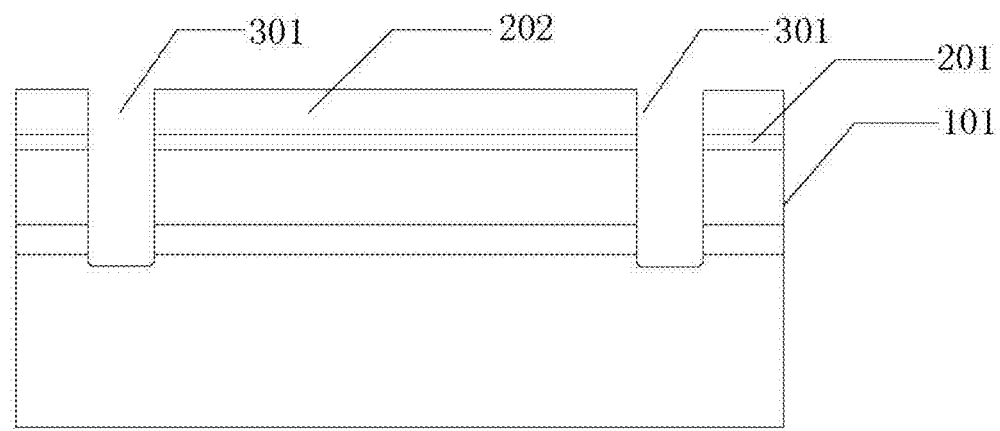
Figure 7D:
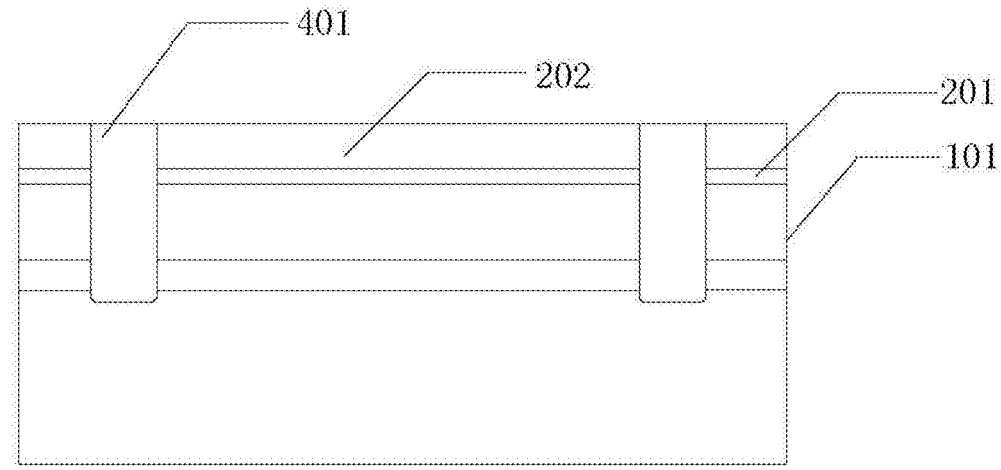
Figure 7E:
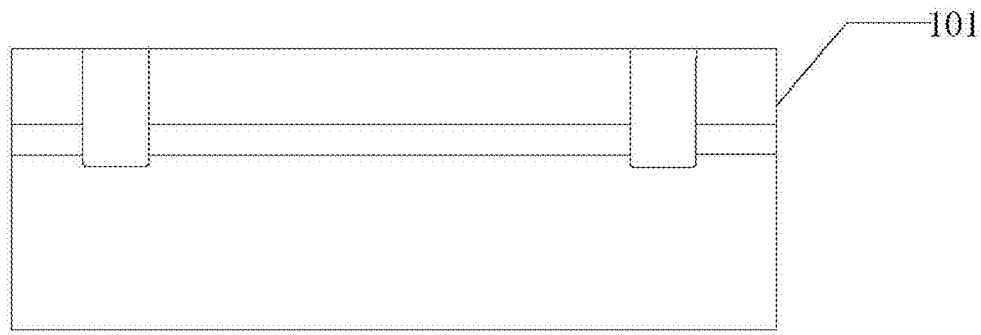
Figure 7F:
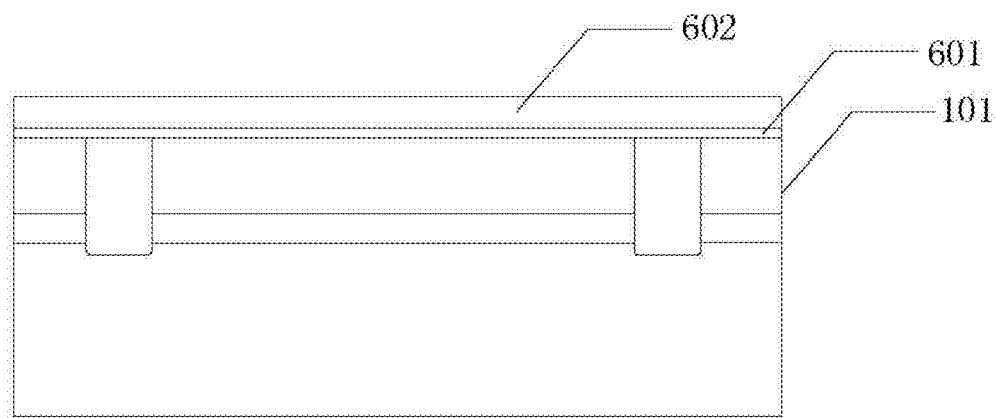
Figure 7G:
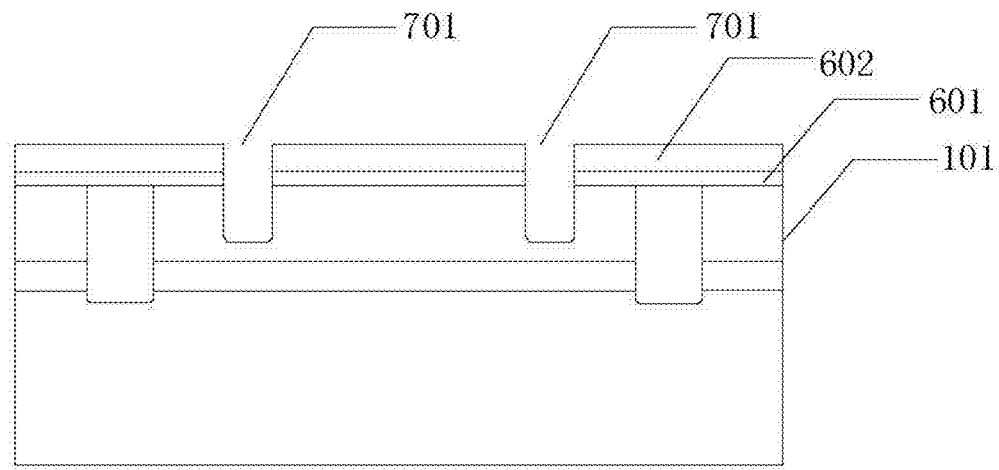
Figure 7H:
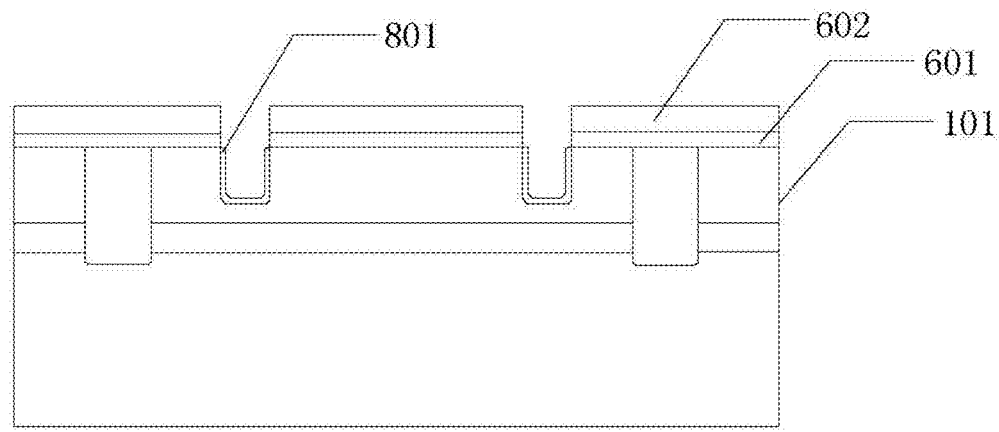
Figure 7I:
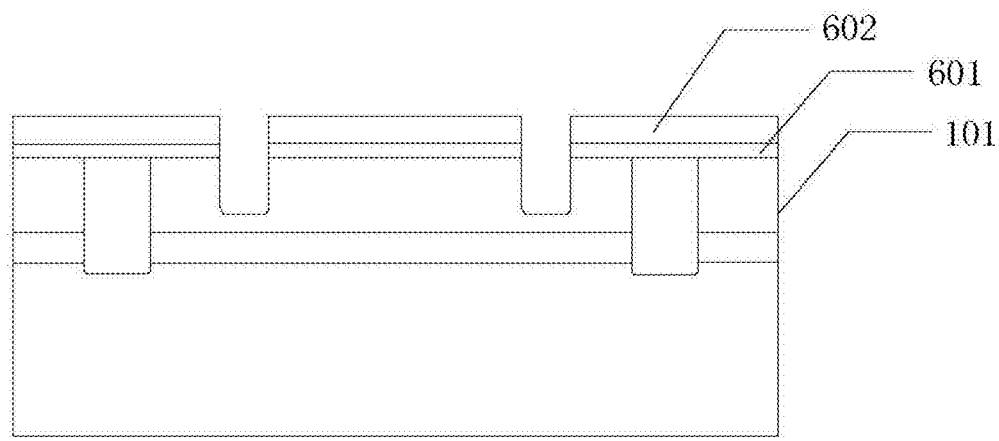
Figure 7J:
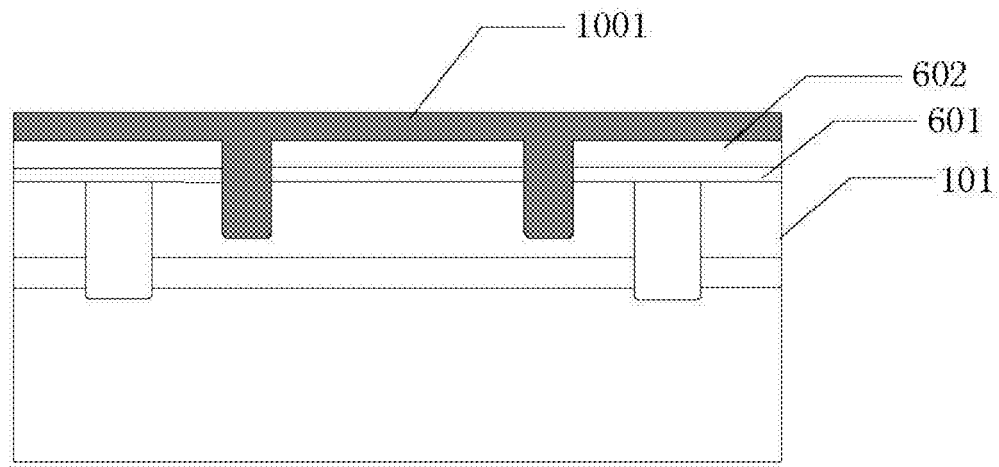
Figure 7K:
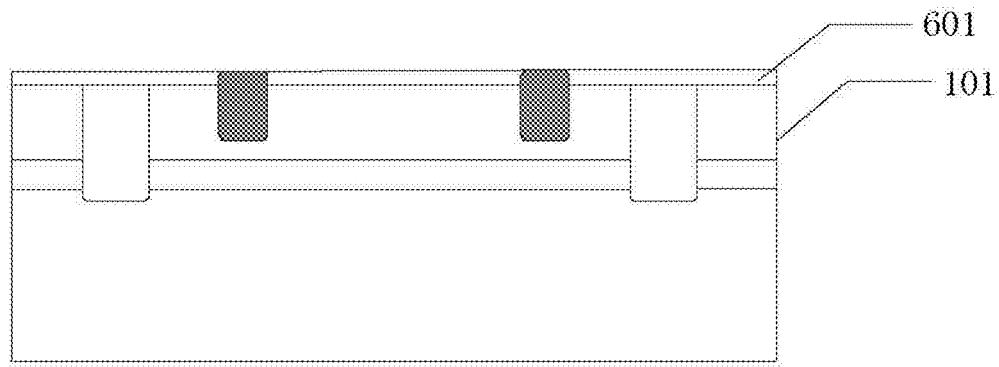
Figure 7L:
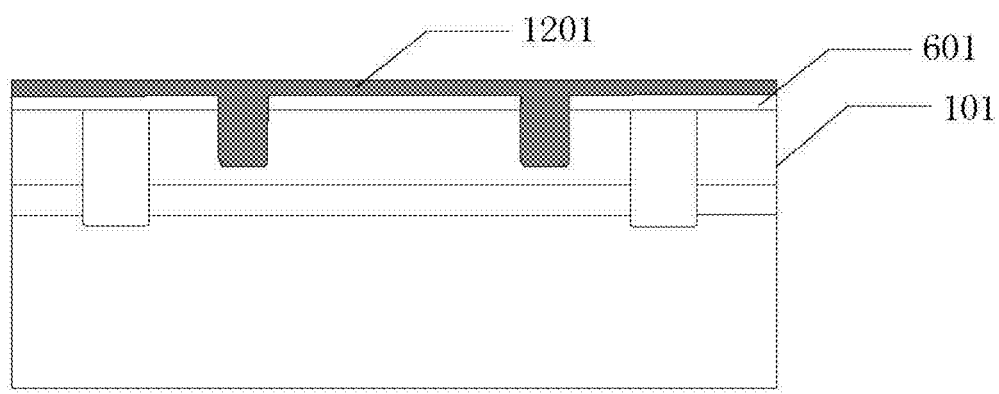
Figure 7M:
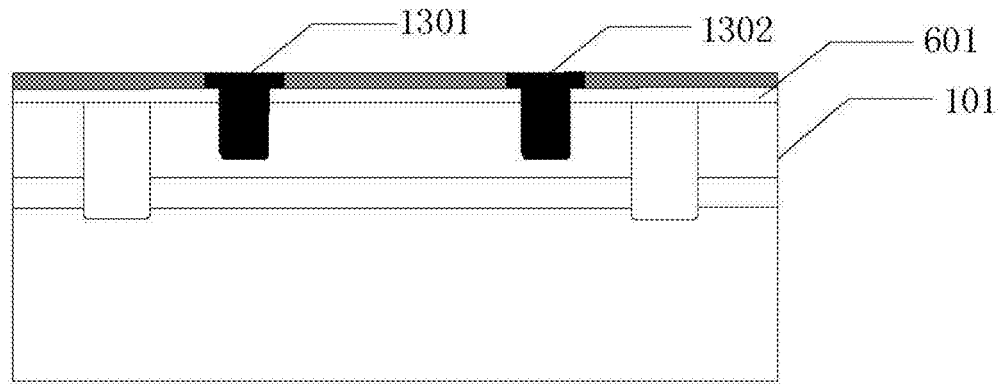
Figure 7N:
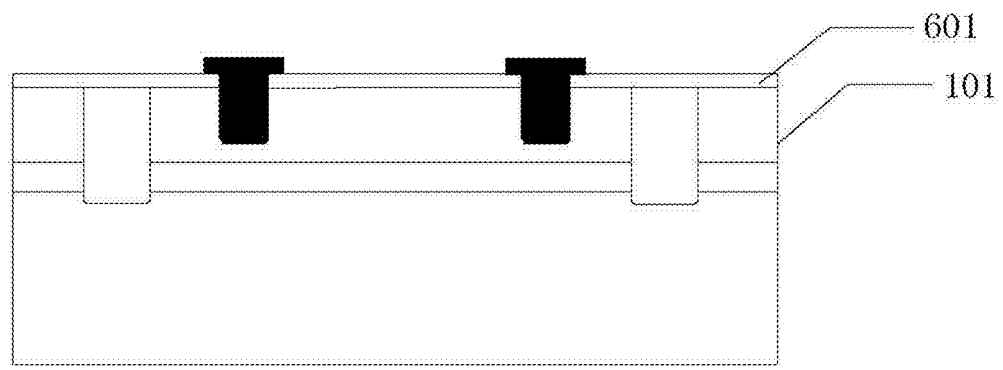
Figure 7O:
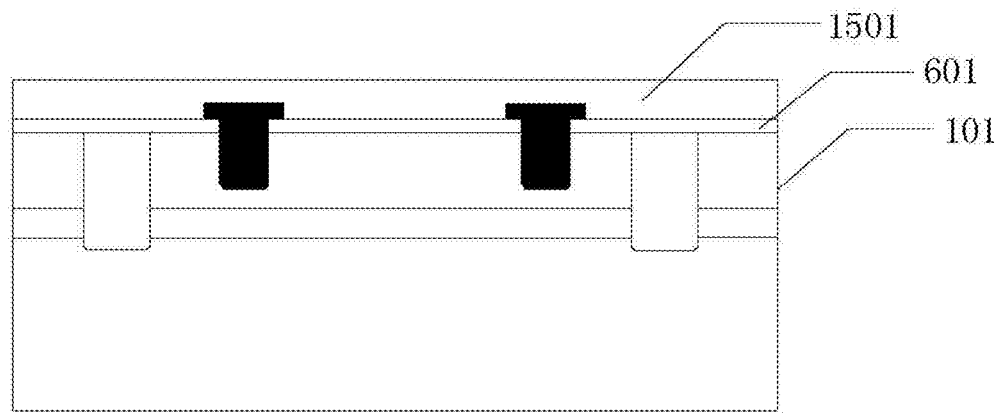
Figure 7P:
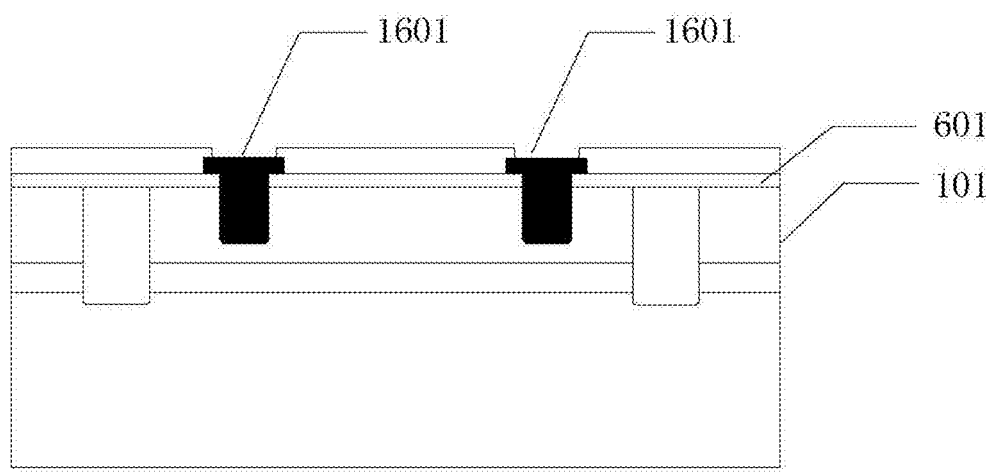
Figure 7Q:
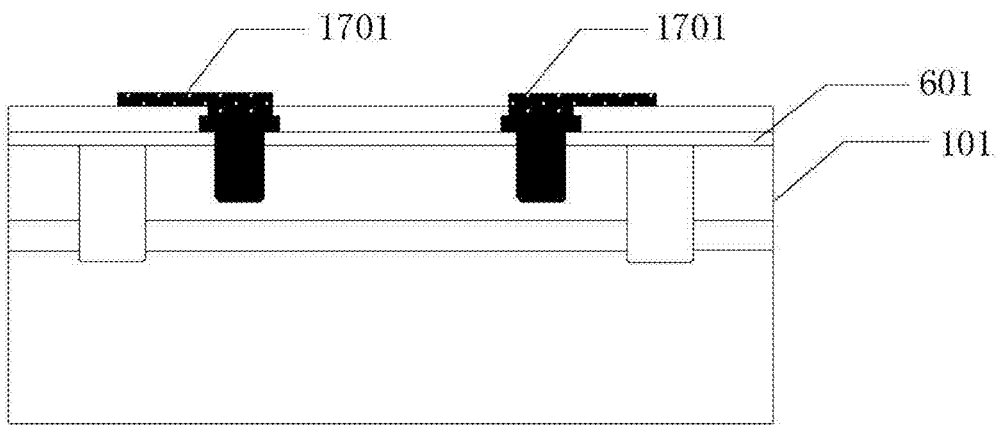
Figure 7R:
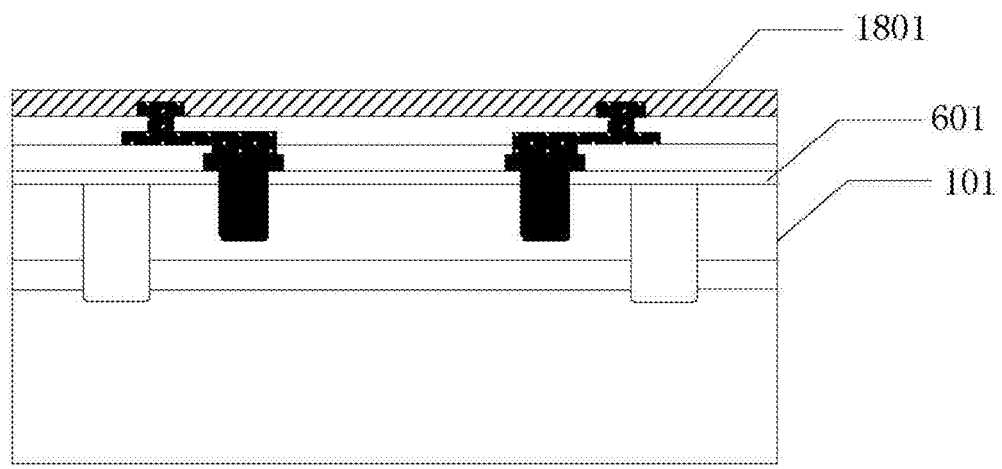

Referring to FIGS. 7A to 7R, FIGS. 7A to 7R are schematic views of a preparation method for a GaAs/Ge/GaAs heterogeneous SPIN diode according to an embodiment of the disclosure. On basis of the above embodiment(s), the preparation of the GaAs/Ge/GaAs heterogeneous SPiN diode with a channel length of 22 nm (a length of a solid-state plasma region is 100 micrometers) is taken as an example for explanation in detail. The specific steps are as follows.

Step 1 is a step of preparing a substrate material and includes:

(1a) as, shown in FIG. 7A, selecting a GeOI substrate 101 with a (100) crystal orientation, a doping type of P-type and a doping concentration of $10^{14}$ cm$^{-3}$, a thickness of a top Ge layer being 50 μm;

(1b) as shown in FIG. 7l3, adopting a chemical vapor deposition (CVD) process to deposit a first SiO$_2$ layer 201 with a thickness of 40 nm on the GeOI substrate; and (1c) depositing a first Si$_3$N$_4$/SiN layer (i.e., silicon nitride layer) 202 with a thickness of 2 μm on the substrate by a CVD process.

Step 2 is an isolation preparing step and includes:

(2a) as shown in FIG. 7C forming an isolation region on the above protective layer by a photolithography process, wet-etching the first Si$_3$N$_4$/SiN layer 202 in the isolation region to form an isolation region pattern; and forming deep isolation trenches 301 with a width of 5 μm and a depth of 50 μm in the isolation region by dry etching;

(2b) as shown in FIG. 7D, depositing a SiO$_2$ 401 to fully fill the deep isolation trenches by a CVD process; and (2c) as shown in FIG. 7E, removing the first Si$_3$N$_4$/SiN layer 202 and the first SiO$_2$ layer 201 on the surface by a chemical mechanical polishing (CMP) process, to planarize the surface of the GeOI substrate.

Step 3 is a step of preparing deep trenches of P and N regions and includes:

(3a) as shown in FIG. 7F, continuously depositing two layers of materials on the substrate by a CVD process, the first layer being a second SiO$_2$ layer 601 with a thickness of 300 nm and the second layer being a second Si$_3$N$_4$/SiN layer 602 with a thickness of 500 nm;

(3b) as shown in FIG. 7G, forming a pattern for the P and N regions by photolithography using a mask, wet-etching the second Si$_3$N$_4$/SiN layer 602 and the second SiO$_2$ layer 601 in the P and N regions to form patterns of the P and N regions; and forming trenches 701 with a width of 4 μm and a depth of 5 μm in the P and N regions by dry etching, lengths of the trenches in the P and N regions being determined according to an application condition of a prepared antenna;

(3c) as shown in FIG. 7H, at 850 degrees Celsius, performing a high temperature treatment for 10 minutes, and oxidizing inner walls of the trenches to form oxide layers 801, so as to planarize the inner walls of the trenches of the P and N regions; and (3d) as shown in FIG. 7I, removing the oxide layers 801 on the inner walls of the trenches of the P and N regions by a wet etching process.

Step 4 is a step of preparing P and N contact regions and includes:

(4a) as shown in FIG. 7J, depositing polycrystalline As 1001 in the trenches of the P and N regions by using a metal-organic chemical vapor deposition (MOCVD) process and fully filling the trenches;

(4b) as shown in FIG. 7K, removing the polycrystalline GaAs 1001 and the second Si$_3$N$_4$/SiN layer 602 on the surface by CMP to make the surface be smooth;

(4c) as shown in FIG. 7L, depositing a layer of polycrystalline GaAs 1201 with a thickness of 200-500 nm on the surface by a CVD method;

(4d) as shown in FIG. 7M, forming a P region active region by photolithography using a mask, performing a P+ implantation by an ion implantation process with a photoresist to make a doping concentration of the P region active region up to $0.5 \times 10^{20}$ cm$^{-3}$, and removing the photoresist to form a P contact 1301;

(4e) forming an N region active region by photolithography using a mask, performing an N+ implantation by an ion implantation process with a photoresist to make a doping concentration of the N region active region up to $0.5 \times 10^{20}$ cm$^{-3}$, and removing the photoresist to form an N contact 1302;

(4f) as shown in FIG. 7N, selectively etching the polycrystalline GaAs 1201 outside the P and N contact regions to form the P and N contact regions;

(4g) as shown in FIG. 7O, depositing a SiO$_2$ 1501 with a thickness of 800 nm on the surface by a CVD method; and (4h) at 1000 degrees Celsius, annealing for 1 minute to activate ion implanted impurities and propel the impurities into the GaAs.

Step 5 is a step of forming the SPiN diode and includes:

(5a) as shown in FIG. 7P, forming lead holes 1601 in the P and N contact regions by photolithography;

(5b) as shown in FIG. 7Q, sputtering a metal on the surface of the substrate, alloying to form a metal silicide 1701 at 750 degrees Celsius, and etching off the surface metal;

(5c) sputtering a metal on the surface of the substrate and forming leads by photolithography; and (5d) as shown in FIG. 7R, depositing Si$_3$N$_4$/SiN to form a passivation layer 1801 and forming PADs by photolithography, to form the SPiN diode as a material for preparing a solid-state plasma antenna.

In the illustrated embodiment, the above various process parameters are all examples, and transformations made according to conventional means of those skilled in the art are all in a protection scope of the disclosure.

According to the SPiN diode applied to the solid-state plasma reconfigurable antenna and prepared by the disclosure, firstly, due to the characteristics of high mobility and long carrier service life of the used Ge material, a solid-state plasma concentration of the SPiN diode is improved. In addition, the P region and N region of the Ge-based SPiN diode adopt a etching-based deep trench polycrystalline GaAs embedding process, the process can provide abrupt p-i and n-i junctions, and can effectively improve junction depths of the p-i and n-i junctions, such that controllability in concentration and distribution of the solid-state plasma are enhanced, which is favorable to prepare the plasma antenna of high performances. Secondly, due to the characteristic of poor thermal stability of an oxide GeO of the Ge material, the treatment of planarizing the side walls of the deep trenches of the P region and the N region can be automatically finished in a high temperature environment, and the manufacturing method for the material is simplified. Thirdly, the GeOI-based SPiN diode applied for the solid-state plasma reconfigurable antenna prepared by the disclosure adopts an etching-based deep trench dielectric isolation process, thereby effectively improving breakdown voltage of the devices and inhibiting influences of a leakage current on the device performances.

Figure 8:
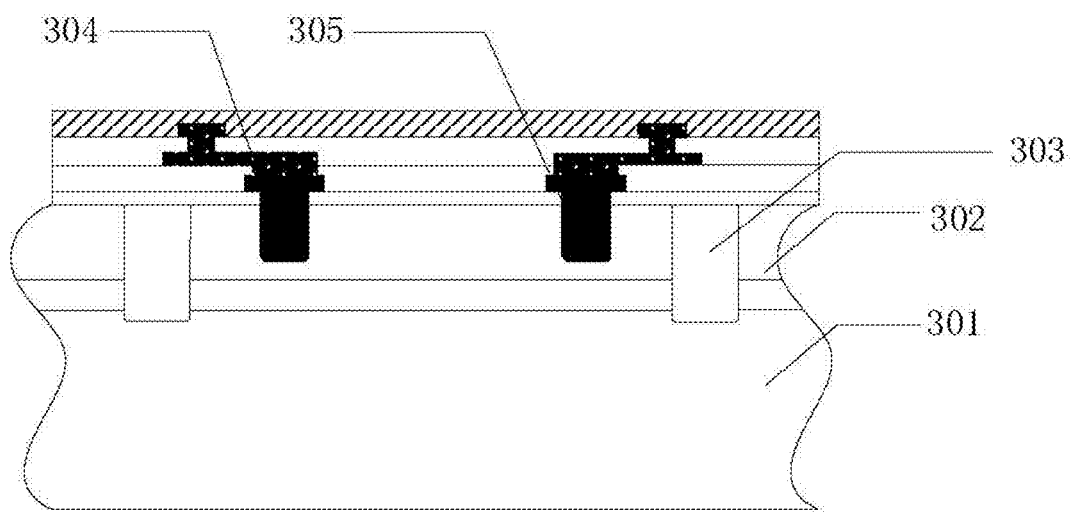
FIG. 8 is a structural schematic view of another GaAs/Ge/GaAs based heterogeneous SPIN diode according to an embodiment of the disclosure.

Referring to FIG. 8, and FIG. 8 is a structural schematic view of a heterogeneous Ge based SPiN diode according to an embodiment of the disclosure. The GaAs/Ge/GaAs heterogeneous SPiN diode is manufactured by the preparation method as shown in FIG. 2. Specifically, the GaAs/Ge/GaAs heterogeneous SPiN diode is prepared on a GeOI substrate 301, and a P region 304 and an N region 305 of the SPiN diode and an i region (intrinsic region) located between the P region 304 and the N region 305 are all located in a top Ge layer 302 of the GeOI substrate. The SPiN diode may adopt STI deep trench isolation, that is, one isolation trench 303 is disposed on an outer side of each of the P region 304 and the N region 305, and depths of the isolation trenches 303 are larger than or equal to a thickness of the top Ge layer 302, i.e., the isolation trenches 303 each penetrate through the top Ge layer 302.

In summary, specific examples are used herein to describe the principle and implementation manners of the solid-state plasma SPiN diode and its preparation method of the disclosure, and the description of the foregoing embodiments is merely used to help understand the method and core idea of the disclosure. At the same time, for those skilled in the art, according to the idea of the disclosure, some changes may be made in the specific implementations and application ranges. Sum up, the content of the present specification should not be construed as a limitation of disclosure. The protection scope of the disclosure should be covered by the appended claims.

INDUSTRIAL PRACTICABILITY

The preparation method for a GaAs/Ge/GaAs heterogeneous SPiN diode for a loop antenna in the disclosure has the following advantages that:

(1) due to the characteristics of high mobility and long carrier service life of the GaAs/Ge/GaAs heterostructure used, by the SPiN diode, a solid-state plasma concentration of the SPiN diode can be effectively improved;

(2) the P and N regions of the SPiN diode adopt a polysilicon embedding process based on deep trench etching, such process can provide abrupt junctions p-i and n-i, and can effectively increase junction depths of the p-i junction and the n-i junction, so that the concentration and distribution of solid-state plasma can be controlled well; and (3) the SPiN diode adopts an etching-based deep trench dielectric isolation process, thereby effectively improving a breakdown voltage of the device and inhibiting influences of a leakage current on the device performances.

What is claimed is:

1. A preparation method for a GaAs/Ge/GaAs heterogeneous spintronic (SPiN) diode for a loop antenna, wherein the loop antenna comprises:
    a semiconductor substrate;
    a dielectric plate;
    a first SPiN diode ring, a second SPiN diode ring, first direct current (DC) bias wires and second DC bias wires, disposed on the semiconductor substrate; and
    a coupling type feed source, disposed on the dielectric plate;
    wherein the first DC bias wires and the second DC bias wires are formed on the semiconductor substrate by heavily doping process;
    wherein the preparation method for the SPiN diode comprises following steps of:
    (a) selecting a germanium-on-insulator (GeOI) substrate;
    (b) etching a top Ge layer of the GeOI substrate to form a first trench and a second trench in the top Ge layer;
    (c) depositing a gallium arsenide (GaAs) material in the first trench and the second trench;
    (d) performing P-type ion implantation into the GaAs material in the first trench to form a P-type active region and performing an N-type ion implantation into the GaAs material in the second trench to form an N-type active region, by ion implantation process; and (e) forming lead holes on surfaces of the P-type active region and the N-type active region and then sputtering a metal, to form the GaAs/Ge/GaAs heterogeneous SPiN diode.

2. The preparation method according to claim 1, before the step (b), further comprising:
   (x1) preparing a silicon oxide (SiO2) material on a surface of the GeOI substrate to form a first SiO2 layer;
   (x2) preparing a silicon nitride (SiN) material on a surface of the first SiO2 layer to form a first SiN layer, to thereby form a first protective layer;
   (x3) etching the first protective layer and the GeOI substrate by dry etching with a first mask, to form isolation trenches in the GeOI substrate;
   (x4) filling the isolation trenches with an isolation material by a chemical vapor deposition (CVD) process; and
   (x5) removing the first protective layer and the isolation material outside the isolation trenches by a chemical mechanical polishing (CMP) process, to form an isolation region of the GaAs/Ge/GaAs heterogeneous SPiN diode.

3. The preparation method according to claim 1, wherein the step (b) comprises:
   (b1) preparing a SiO2 material on a surface of the GeOI substrate to form a second SiO2 layer;
   (b2) preparing a SiN material on a surface of the second SiO2 layer to form a second SiN layer, and thereby forming a second protective layer; and
   (b3) etching the second protective layer and the top Ge layer by anisotropic etching with a second mask, to form the first trench and the second trench in the top Ge layer.

4. The preparation method according to claim 1, before the step (c), further comprising:
   (y1) at 800-900 degrees Celsius, oxidizing the first trench and the second trench to form oxide layers on inner walls of the first trench and the second trench; and
   (y2) etching the oxide layers on the inner walls of the first trench and the second trench by a wet etching process to planarize the inner walls of first trench and the second trench.

5. The preparation method according to claim 1, wherein the step (c) comprises:
   (c1) depositing the GaAs material in the first trench and the second trenches by a metal-organic chemical vapor deposition (MOCVD) process;
   (c2) removing the GaAs material of a certain thickness outside the first trench and the second trench by a CMP process to planarize the first trench and the second trench.

6. The preparation method according to claim 1, wherein the step (d) comprises:
   (d1) performing a boron (B) ion implantation into the GaAs material in the first trench by an ion implantation process with a third mask, to form the P-type active region;
   (d2) performing a phosphorus (P) ion implantation into the GaAs material in the second trench by an ion implantation process with a fourth mask, to form the N-type active region;
   (d3) depositing a SiO2 material on surfaces of the P-type active region and the N-type active region and activating impurities of the P-type active region and the N-type active region by an annealing process; and
   (d4) removing the SiO2 material.

7. The preparation method according to claim 1, wherein the step (e) comprises:
   (e1) depositing a SiO2 material on an entire surface of the GeOI substrate;
   (e2) etching off the SiO2 material in part of positions in surfaces of the P-type active region and the N-type active region by an anisotropic etching process with a fifth mask, to form the lead holes;
   (e3) sputtering a metal material in the lead holes; and
   (e4) performing a passivation treatment and forming PADs by photolithography, to form the GaAs/Ge/GaAs heterogeneous SPiN diode.

8. The preparation method according to claim 1, wherein the first SPiN diode ring comprises first SPiN diode strings, the second SPiN diode ring comprises second SPiN diode strings, and a perimeter of each of the first SPiN diode ring and the second SPiN diode ring is equal to an electromagnetic wavelength of a signal to be received.

9. The preparation method according to claim 1, wherein the coupling type feed source is formed on the dielectric plate; and the dielectric plate is provided with a metal microstrip patch on an upper surface and a metal grounding plate on a lower surface.

10. The preparation method according to claim 9, wherein the metal microstrip patch comprises a main branch, first sub-branches and second sub-branches.

* * * * *